(12) United States Patent
Liu

(10) Patent No.: US 7,721,161 B2
(45) Date of Patent: May 18, 2010

(54) METHOD FOR CONTROLLING MEMORY ACCESS

(75) Inventor: Wei-Li Liu, Taipei County (TW)

(73) Assignee: Nanya Technology Corporation, Taoyuan (TW)

( * ) Notice: Subject to any disclaimer, the term of this patent is extended or adjusted under 35 U.S.C. 154(b) by 391 days.

(21) Appl. No.: 11/758,677

(22) Filed: Jun. 6, 2007

(65) Prior Publication Data

US 2008/0195889 A1  Aug. 14, 2008

(30) Foreign Application Priority Data

Feb. 12, 2007  (TW) .............................. 96105037 A

(51) Int. Cl.
*G06F 11/00* (2006.01)

(52) U.S. Cl. ...................................... 714/54

(58) Field of Classification Search ................ 714/5–9, 714/15–18, 20, 21, 25, 27, 39, 42, 47, 48, 714/52, 54
See application file for complete search history.

(56) References Cited

U.S. PATENT DOCUMENTS

| 5,978,934 | A  | * | 11/1999 | Gates ........................... 714/41 |
| 7,562,285 | B2 | * | 7/2009 | Yang et al. .................... 714/815 |
| 2002/0046383 | A1 | * | 4/2002 | Melanson et al. ........... 714/773 |
| 2007/0162825 | A1 | * | 7/2007 | Wang et al. .................. 714/763 |

* cited by examiner

*Primary Examiner*—Nadeem Iqbal
(74) *Attorney, Agent, or Firm*—Jianq Chyun IP Office

(57) ABSTRACT

A cyclic redundancy check (CRC) is used for improving error check coverage during memory access. In memory reading process, a part of read data is outputted from the memory via a CRC bus, and a CRC result and the other part of the read data are outputted from the memory via a data bus.

13 Claims, 4 Drawing Sheets

METHOD FOR CONTROLLING MEMORY ACCESS

CROSS-REFERENCE TO RELATED APPLICATION

This application claims the priority benefit of Taiwan application serial no. 96105037, filed Feb. 12, 2007. All disclosure of the Taiwan application is incorporated herein by reference.

BACKGROUND OF THE INVENTION

1. Field of the Invention

The present invention relates to a method for controlling memory access, and more particularly to a method for controlling memory access through a cyclic redundancy check (CRC) for improving error check coverage.

2. Description of Related Art

In communication systems or computer systems, a cyclic redundancy check (CRC) can be adopted to improve error check coverage. The CRC is capable of monitoring if errors occur during data transmission after the data are transmitted or stored. In the process of transmitting the data, both the data receiver and the data source are required to implement a CRC computation, and one of the parties compares the CRC results respectively computed, so as to detect if the received data are erroneous.

Please refer to FIG. 1 which illustrates a conventional technology of applying a CRC-16 to memory access control in computer systems. The following description is given on the conditions of an 800-MHz system clock, an 8-bit data bus DQ<7:0>, and a 2-bit CRC bus CRC<1:0>. A 16-bit CRC result is acquired when the CRC-16 is applied.

As shown in FIG. 1, a main control circuit (e.g. CPU) issues reading instructions R-A and R-B to a memory. After several cycles, internal data D-A and D-B in the memory are retrieved in response to the reading instructions R-A and R-B. Here, the "internal data" denote that the data have not been placed on the data bus DQ<7:0>. The data D-A includes 8 bytes A0~A7 while the data D-B includes 8 bytes B0~B7. Based on the internal data D-A and D-B, a CRC computation CRC-AB is carried out by a memory controller.

When the data D-A and D-B are to be outputted by the memory, some bytes (e.g. A3 and B3) are placed on the CRC bus CRC<1:0> while the other bytes are placed on the data bus DQ<7:0>. Note that the space between A0 and A1 as indicated in FIG. 1 represents a non-transmission of data on the data bus DQ<7:0>.

As the data are outputted via the data bus DQ<7:0>, the CRC computation CRC-AB is initiated. As shown in FIG. 1, after the CRC computation CRC-AB is completed, the result of the CRC computation CRC-AB is transmitted via the CRC bus CRC<1:0>.

As such, the data D-A and D-B are read from the memory and the CRC result is outputted to the main control circuit.

However, the conventional technology has the following drawbacks of (1) complex hardware structure, large circuit layout, and high power consumption; (2) tight CAS to CAS delay latency (tCCD-L) e.g. 1.25 ns which leads to difficulty in design; (3) long time delay from issuing the reading instruction to outputting the data from the memory; (4) maintenance of data A and B in cache during the CRC computation, which leads to further difficulty in design; (5) difficulty in completion of the CRC computation within an extremely short time lapse (in 1.25 ns as exemplified by FIG. 1).

Accordingly, a method of controlling memory access is desirable given that the method is capable of overcoming said drawbacks of the conventional technology.

SUMMARY OF THE INVENTION

The present invention provides a method for controlling memory access. According to the method, a result of a cyclic redundancy check (CRC) computation is outputted via a data bus, while a part of read data is outputted via a CRC bus in a process of reading data from a memory. In the process of writing data to the memory, data are received via the data bus and the corresponding CRC result is outputted via the CRC bus.

The present invention provides a method for controlling memory access. As the CRC computation is in process, it is unnecessary to hold two or more data simultaneously but to maintain the data under CRC computation.

One example of the present invention provides a method for controlling memory access, including issuing a first reading instruction to a memory; retrieving first read data from the memory in response to the first reading instruction; performing CRC computation on the first read data to obtain a first CRC result; transmitting a part of the first read data via a data bus and transmitting the other part of the first read data via a CRC bus; and transmitting the first CRC result via the data bus.

The present invention further provides a method for controlling memory access, including issuing a first reading instruction and a second reading instruction to a memory; retrieving first read data from the memory in response to the first reading instruction; performing CRC computation on the first read data to obtain a first CRC result; retrieving second read data from the memory in response to the second reading instruction; performing CRC computation on the second read data to obtain a second CRC result; transmitting a part of the first read data via a data bus and transmitting the other part of the first read data via a CRC bus; transmitting the first CRC result via the data bus; transmitting a part of the second read data via the data bus and transmitting the other part of the second read data via the CRC bus; and transmitting the second CRC result via the data bus.

Another example of the present invention further provides a method for controlling memory access, including issuing a first writing instruction and a first reading instruction to a memory; transmitting first written data in relation to the first writing instruction to the memory via a data bus; performing CRC computation on the first written data to obtain a first CRC result; transmitting the first CRC result via a CRC bus; retrieving first read data from the memory in response to the first reading instruction; performing CRC computation on the first read data to obtain a second CRC result; transmitting a part of the first read data via the data bus and transmitting the other part of the first read data via the CRC bus; and transmitting the second CRC result via the data bus.

In order to make the aforementioned and other objects, features and advantages of the present invention more comprehensible, preferred embodiments accompanied with figures are described in detail below.

DESCRIPTION OF EMBODIMENTS

In the present invention, a CRC result is outputted via a data bus while a part of read data is outputted via a CRC bus in a process of reading the data from a memory. In the process of writing the data to the memory, data are received via the data bus and the CRC result is outputted via the CRC bus. In addition, as a CRC computation is in process, it is unnecessary to hold two or more data simultaneously but to maintain the data under CRC computation.

First Embodiment: Read to Read

Figure 1:
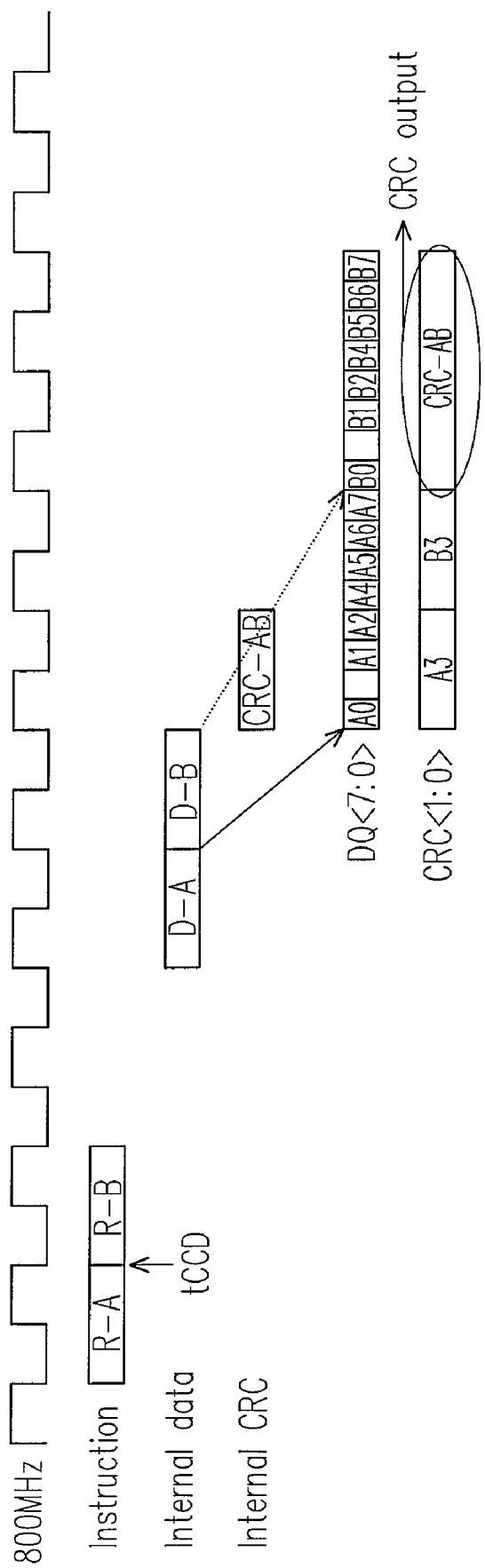
FIG. 1 is a timing schematic view showing a sequence of memory access according to a conventional technology.
Figure 2:
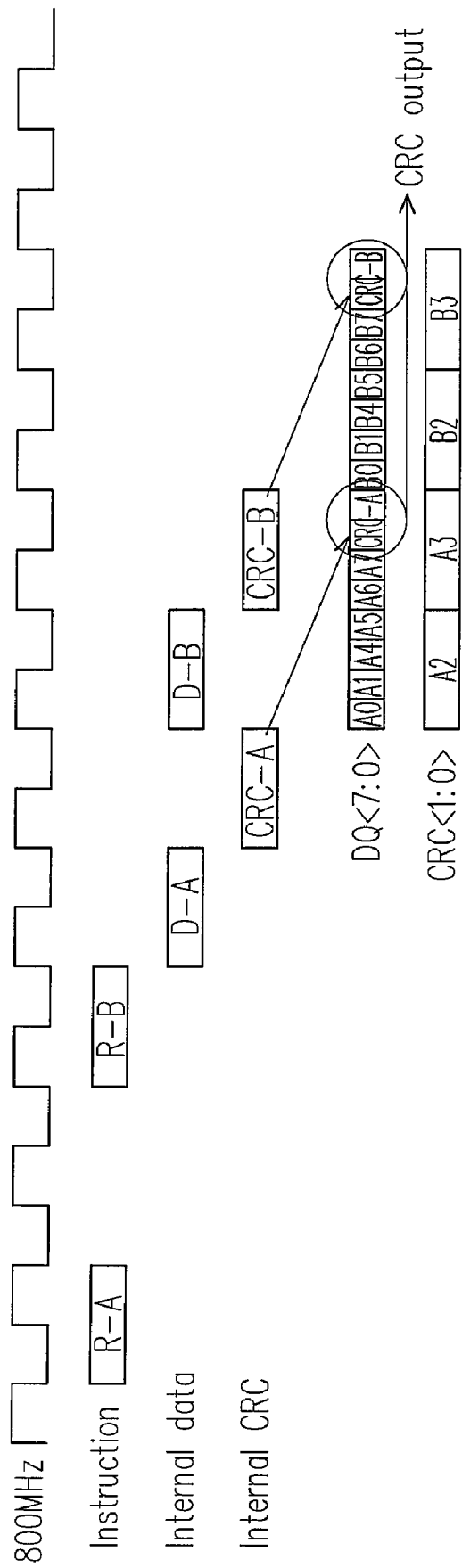
FIG. 2 is a timing schematic view showing a sequence of memory access according to an embodiment of the present invention.

Please refer to FIG. 2 which is a timing schematic view showing a sequence of memory access according to an embodiment of the present invention. The following description is given on the conditions of an 800-MHz system clock, an 8-bit data bus DQ<7:0>, and a 2-bit CRC bus CRC<1:0>. The CRC computation is described by taking CRC-16 for an example (i.e. a 16-bit CRC result is obtained). It is certain that the present embodiment is not limited to said conditions. For example, other CRC technologies e.g. CRC-32 are also applicable in the present embodiment so as to further improve error check coverage.

As shown in FIG. 2, a main control circuit (e.g. CPU) issues reading instructions R-A and R-B to a memory. After several cycles, internal data D-A and D-B in the memory are retrieved in response to the reading instructions R-A and R-B. Here, the "internal data" denote that the data have not been placed on the data bus DQ<7:0>. The data D-A includes 8 bytes A0~A7 while the data D-B includes 8 bytes B0~B7.

As the data D-A is retrieved, a CRC computation is implemented on the data D-A as soon as possible, which is referred to as CRC-A in FIG. 2. Likewise, as the data D-B is retrieved, the CRC computation is implemented on the data D-B as soon as possible, which is referred to as CRC-B in FIG. 2.

When the data D-A is to be outputted, some bytes (e.g. A2 and A3) are placed on the CRC bus CRC<1:0> while the other bytes (e.g. A0~A1 and A4~A7) are placed on the data bus DQ<7:0>. Please note that the result of the CRC computation CRC-A of the data D-A is placed on the data bus DQ<7:0> instead of on the CRC bus CRC<1:0>.

Similarly, when the data D-B is to be outputted, some bytes (e.g. B2 and B3) are placed on the CRC bus CRC<1:0> while the other bytes (e.g. B0~B1 and B4~B7) are placed on the data bus DQ<7:0>. The result of the CRC computation CRC-B on the data D-B is also placed on the data bus DQ<7:0> instead of on the CRC bus CRC<1:0>.

As such, the data D-A and D-B are read from the memory and the CRC result is transmitted to the main control circuit.

Even though the instructions in the first embodiment are in a read-read order, it is known by those skilled in the art from the above description that how to apply the first embodiment to the instructions arranged in similar manners, such as in a read-read-read order.

Second Embodiment: Read to Write

Figure 3:
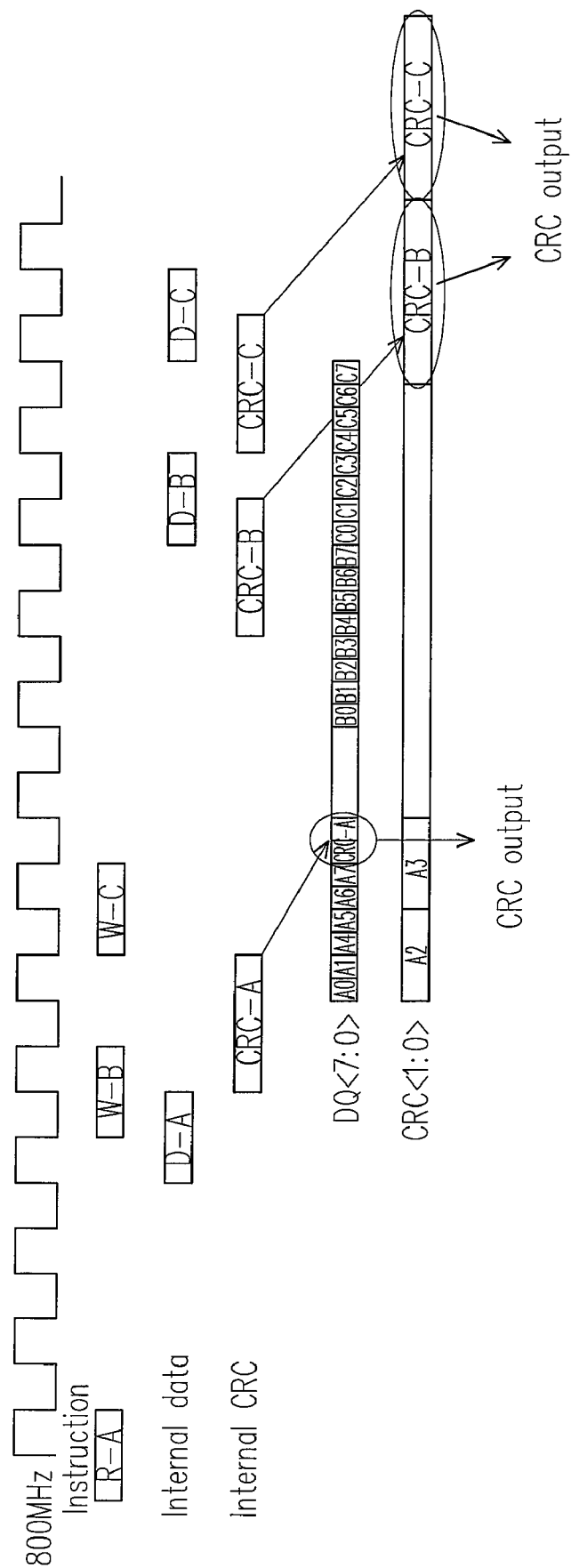
FIG. 3 is a timing schematic view showing a sequence of read-to-write memory access according to a second embodiment of the present invention.

Please refer to FIG. 3 which is a timing schematic view showing a sequence of read-to-write memory access according to a second embodiment of the present invention. The following description is given on the conditions of an 800-MHz system clock, an 8-bit data bus DQ<7:0>, and a 2-bit CRC bus CRC<1:0>. The CRC computation is described by taking CRC-16 for an example (i.e. a 16-bit CRC result is obtained). It is certain that the present embodiment is not limited to said conditions. For example, other CRC technologies e.g. CRC-32 are also applicable in the present embodiment so as to further improve error check coverage.

As shown in FIG. 3, a main control circuit (e.g. CPU) issues a reading instruction R-A and writing instructions W-B and W-C to a memory. After several cycles are completed, an internal data D-A in the memory is retrieved in response to the reading instruction R-A. 8 bytes A0~A7 are included in the data D-A.

As the data D-A is retrieved, a CRC computation is performed on the data D-A as soon as possible, which is referred to as CRC-A in FIG. 3.

When the data D-A is to be outputted, some bytes (e.g. A2 and A3) are placed on the CRC bus CRC<1:0> while the other bytes (e.g. A0~A1 and A4~A7) are placed on the data bus DQ<7:0>. Please note that the result of the CRC computation CRC-A of the data D-A is placed on the data bus DQ<7:0> instead of on the CRC bus CRC1:0>.

After several cycles from issue of the writing instruction W-B, data B0-B7 are transmitted by the main control circuit to the memory via the data bus DQ<7:0>. After the data B0~B7 are completely received, the writing instruction W-B is executed to write the data D-B (including 8 bytes B0~B7) into the memory.

In the present embodiment, it is not necessary to initiate the CRC computation after the data B0~B7 are all received. Contrarily, the CRC computation can be initiated after a part of the data B0~B7 is received, which is referred to as CRC-B in FIG. 3. After the CRC computation CRC-B is finished, the result of the CRC computation CRC-B is transmitted back to the main control circuit via the CRC bus CRC1:0> so as to implement an error check.

Likewise, after several cycles from issue of the writing instruction W-C, data C0~C7 are transmitted by the main control circuit to the memory via the data bus DQ<7:0>. After the data C0~C7 are completely received, the writing instruction W-C is executed to write the data D-C (including 8 bytes C0~C7) into the memory.

Similarly, it is not necessary to initiate the CRC computation after the data C0~C7 are all received. Contrarily, the CRC computation can be initiated after a part of the data C0~C7 is received, which is referred to as CRC-C in FIG. 3. After the CRC computation CRC-C is finished, the result of the CRC computation CRC-C is transmitted back to the main control circuit via the CRC bus CRC<1:0> so as to implement the error check.

As such, the data D-A is completely read from the memory, the data D-B and D-C are written into the memory, and the CRC results CRC-A, CRC-B and CRC-C are transmitted back to the main control circuit.

Even though the instructions in the second embodiment are in a read-write-write order, it is known by those skilled in the art from the above description that how to apply the second embodiment to the instructions arranged in similar manners, such as in a read-write-read order.

Third Embodiment: Write to Read

Figure 4:
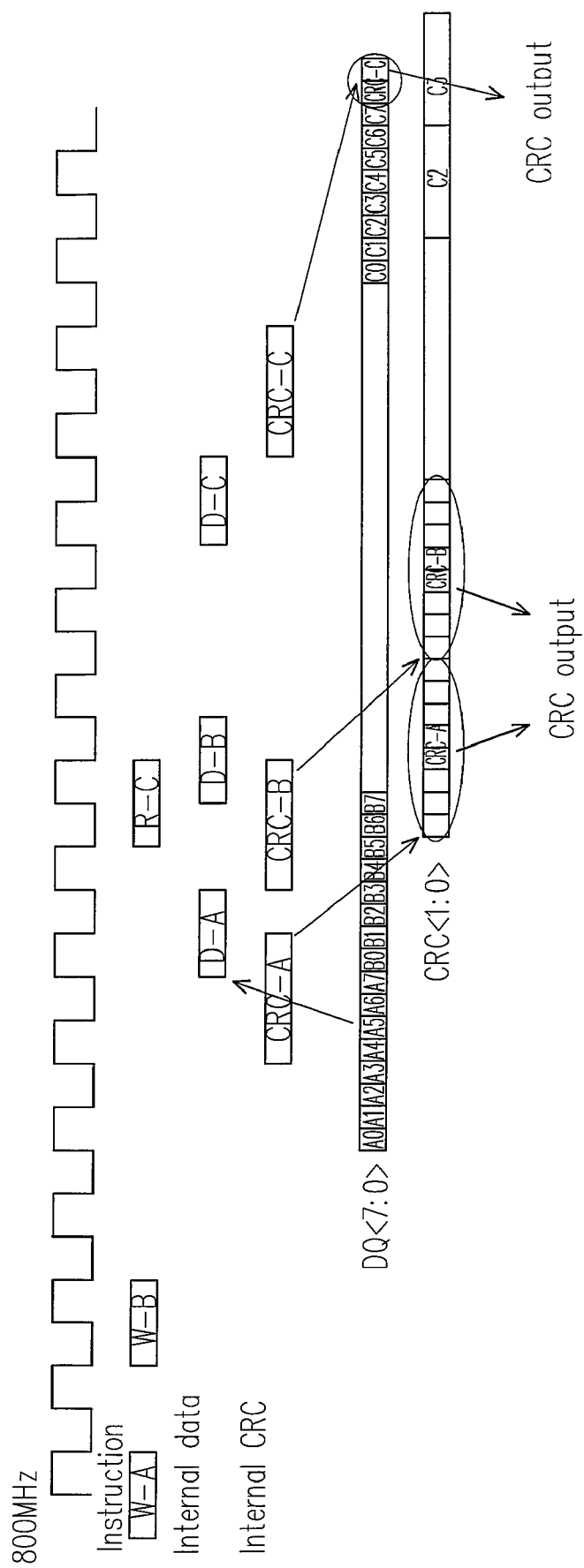
FIG. 4 is a timing schematic view showing a sequence of write-to-read memory access according to a third embodiment of the present invention.

Please refer to FIG. 4 which is timing a schematic view showing a sequence of write-to-read memory access according to a third embodiment of the present invention. The following description is given on the conditions of an 800-MHz system clock, an 8-bit data bus DQ<7:0>, and a 2-bit CRC bus CRC<1:0>. A CRC computation is described by taking CRC-16 for an example (i.e. a 16-bit CRC result is obtained). It is certain that the present embodiment is not limited to said conditions. For example, other CRC technologies e.g. CRC-32 are also applicable in the present embodiment so as to further improve error check coverage.

As shown in FIG. 4, a main control circuit (e.g. CPU) issues writing instructions W-A and W-B and a reading instruction R-C to a memory.

After several cycles from issue of the writing instruction W-A, data A0~A7 are transmitted by the main control circuit to the memory via the data bus DQ<7:0>. After the data A0~A7 are completely received, the writing instruction W-A is executed to write the data D-A (including 8 bytes A0~A7) into the memory.

In the present embodiment, it is not necessary to initiate the CRC computation after the data A0~A7 are all received. Contrarily, the CRC calculation can be initiated after a part of the data A0~A7 is received, which is referred to as CRC-A in FIG. 4. After the CRC computation CRC-A is finished, the result of the CRC computation CRC-A is transmitted back to the main control circuit via the CRC bus CRC<1:0> so as to implement an error check.

Likewise, after several cycles from issue of the writing instruction W-B, data B0~B7 are transmitted by the main control circuit to the memory via the data bus DQ<7:0>. After the data B0~B7 are completely received, the writing instruction W-B is executed to write the data D-B (including 8 bytes B0~B7) into the memory.

Similarly, in the present embodiment, it is not necessary to initiate the CRC computation after the data B0~B7 are all received. Contrarily, the CRC computation can be initiated after a part of the data B0~B7 is received, which is referred to as CRC-B in FIG. 4. After the CRC computation CRC-B is finished, the result of the CRC computation CRC-B is transmitted back to the main control circuit via the CRC bus CRC<1:0> so as to implement an error check.

After several cycles, an internal data D-C in the memory is retrieved in response to the reading instruction R-C. 8 bytes C0~C7 are included in the data D-C.

As the internal data D-C is retrieved, the CRC computation is implemented on the data D-C as soon as possible, which is referred to as CRC-C in FIG. 4.

When the data D-C is to be outputted, some bytes (e.g. C2 and C3) are placed on the CRC bus CRC<1:0> while the other bytes (e.g. C0~C1 and C4~C7) are placed on the data bus DQ<7:0>. Please note that the result of the CRC computation CRC-C of the data D-C is placed on the data bus DQ<7:0> instead of on the CRC bus CRC1:0>.

As such, the data D-A and D-B are completely written into the memory, the data D-C is read from the memory, and the CRC results CRC-A, CRC-B and CRC-C are transmitted back to the main control circuit.

Even though the instructions in the third embodiment are in a write-write-read order, it is known by those skilled in the art from the above description that how to apply the third embodiment to the instructions arranged in similar manners, such as in a write-read-write order.

To sum up, said embodiments of the present invention are characterized by the advantages of (1) uncomplex hardware structure, reduced circuit layout, and low power consumption; (2) relaxed CAS to CAS delay latency (tCCD-L) e.g. 2.5 ns which leads to simplicity in design; (3) unnecessity of maintenance of several data in cache during the CRC computation, which leads to further simplicity in design; (4) completion of the CRC computation within a sufficient time lapse (in 1.875 ns as shown in FIG. 2); (5) high error check rate.

The embodiments of the present invention can be applied to memories (e.g. DDR4) having high speed and great capacity and meet the requirements for rapidity and significant data transmission.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for controlling memory access, comprising:
issuing a first reading instruction to a memory;
retrieving first read data from the memory in response to the first reading instruction;
performing error check computation on the first read data after the first read data is retrieved to obtain a first error check result; and
when the first read data is to be outputted, simultaneously transmitting a part of the first read data and the first error check result tightly following the part of the first read data via a same data bus after the first error check result is obtained and transmitting the other part of the first read data via an error check bus.

2. The method of claim 1, further comprising:
issuing a second reading instruction to the memory after the first reading instruction is issued;
retrieving second read data from the memory in response to the second reading instruction;
performing error check computation on the second read data after the second read data is retrieved to obtain a second error check result; and
when the second read data is to be outputted, simultaneously transmitting a part of the second read data and the second error check result tightly following the part of the second read data via the same data bus after the second error check result is obtained and transmitting the other part of the second read data via the error check bus.

3. The method of claim 1, further comprising:
issuing a first writing instruction to the memory after the first reading instruction is issued;
transmitting first written data in relation to the first writing instruction to the memory via the data bus;
performing error check computation on the first written data to obtain a second error check result; and
transmitting the second error check result via the error check bus.

4. The method of claim 3, further comprising:
issuing a second writing instruction to the memory after the first writing instruction is issued;
transmitting second written data in relation to the second writing instruction to the memory via the data bus;
performing error check computation on the second written data to obtain a third error check result; and
transmitting the third error check result via the error check bus.

5. The method of claim 1, wherein the error check computation is cyclic redundancy check (CRC).

6. The method of claim 2, wherein the error check computation is CRC.

7. The method of claim 3, wherein the error check computation is CRC.

8. The method of claim 4, wherein the error check computation is CRC.

9. A method for controlling memory access, comprising:
issuing a first reading instruction and a second reading instruction to a memory;
retrieving first read data from the memory in response to the first reading instruction;
performing cyclic redundancy check (CRC) on the first read data after the first read data is retrieved to obtain a first CRC result;
retrieving second read data from the memory in response to the second reading instruction;
performing CRC on the second read data after the second read data is retrieved to obtain a second CRC result;
when the first read data is to be outputted, simultaneously transmitting a part of the first read data and the first CRC result tightly following the part of the first read data via a same data bus after the first CRC result is obtained and transmitting the other part of the first read data via a CRC bus; and
when the second read data is to be outputted, simultaneously transmitting a part of the second read data and the second CRC result tightly following the part of the second read data via the same data bus after the second CRC result is obtained and transmitting the other part of the second read data via the CRC bus.

10. A method for controlling memory access, comprising:
issuing a first writing instruction and a first reading instruction to a memory;
transmitting first written data in relation to the first writing instruction to the memory via a data bus;
performing error check computation on the first written data to obtain a first error check result;
transmitting the first error check result via an error check bus;
retrieving first read data from the memory in response to the first reading instruction;
performing error check computation on the first read data after the first read data is retrieved to obtain a second error check result; and
when the first read data is to be outputted, simultaneously transmitting a part of the first read data and the second error check result tightly following the part of the first read data via the data bus after the second error check result is obtained and transmitting the other part of the first read data via the error check bus.

11. The method of claim 10, further comprising:
issuing a second writing instruction to the memory;
transmitting second written data in relation to the second writing instruction to the memory via the data bus;
performing error check computation on the second written data to obtain a third error check result; and
transmitting the third error check result via the error check bus.

12. The method of claim 10, wherein the error check computation is CRC.

13. The method of claim 11, wherein the error check computation is CRC.

* * * * *